United States Patent
Tsai et al.

(10) Patent No.: US 9,934,925 B2
(45) Date of Patent: Apr. 3, 2018

(54) FUSE STRUCTURES AND FORMING AND OPERATION METHODS THEREOF

(71) Applicant: Taiwan Semiconductor Manufacturing Co., Ltd., Hsinchu (TW)

(72) Inventors: Chia-Chou Tsai, Hsinchu (TW); Mu-Yi Lin, Taichung (TW); Tzy-Kuang Lee, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 46 days.

(21) Appl. No.: 14/941,671

(22) Filed: Nov. 16, 2015

(65) Prior Publication Data
US 2017/0140891 A1    May 18, 2017

(51) Int. Cl.
*H01H 85/06* (2006.01)

(52) U.S. Cl.
CPC .................. *H01H 85/06* (2013.01)

(58) Field of Classification Search
CPC ...... H01H 85/06; H01H 85/055; H01H 37/46; H01H 43/301; H01H 85/0073; H01H 85/0039; G01K 5/00; H05B 1/0216; F23N 5/02

USPC ....... 337/297, 290, 382, 384, 393, 394, 395, 337/396, 157, 312, 334, 337

See application file for complete search history.

(56) References Cited

U.S. PATENT DOCUMENTS

| | | | | |
|---|---|---|---|---|
| 5,389,814 A * | 2/1995 | Srikrishnan | ......... | H01L 23/5256 257/529 |
| 7,642,176 B2 * | 1/2010 | Cheng | ................ | H01L 23/5256 257/209 |
| 2005/0122204 A1 * | 6/2005 | Voldman | .............. | H01H 85/046 337/167 |
| 2008/0080153 A1 * | 4/2008 | Nakamura | ........... | H05K 1/0271 361/767 |
| 2015/0022310 A1 * | 1/2015 | Gratz | ..................... | H01H 85/30 337/227 |
| 2015/0303012 A1 * | 10/2015 | Jung | ........................ | H02H 7/18 337/414 |
| 2016/0071680 A1 * | 3/2016 | Mukai | ................. | H01H 37/761 337/183 |

* cited by examiner

*Primary Examiner* — Anatoly Vortman
*Assistant Examiner* — Stephen Sul
(74) *Attorney, Agent, or Firm* — JCIPRNET

(57) ABSTRACT

Fuse structures and forming and operation methods thereof are disclosed. One of the fuse structures includes a dielectric strip and a fuse strip extending in different directions. The dielectric strip is sandwiched by a first conductive strip and a second conductive strip. The fuse strip is insulated from each of the first conductive strip and the second conductive strip and has a blowing region corresponding to the dielectric strip.

16 Claims, 11 Drawing Sheets

FUSE STRUCTURES AND FORMING AND OPERATION METHODS THEREOF

BACKGROUND

Fuses are frequently used to reconfigure memory and logic circuitry. For example, in dynamic or static memory chips, defective memory cells or circuitry may be replaced by selectively blowing (destroying) fuses associated with the defective circuitry while activating redundant circuitry to form new circuitry. This circuit rerouting technique using selectively destroyed fuse links contributes to enhanced yields without the necessity of scrapping defective process wafers.

Although existing fuses and the forming methods thereof have been generally adequate for their intended purposes, they have not been entirely satisfactory in all respects. For example, the fuse blowing step is performed to one fuse at a time, so it is very time consuming. There is a need to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
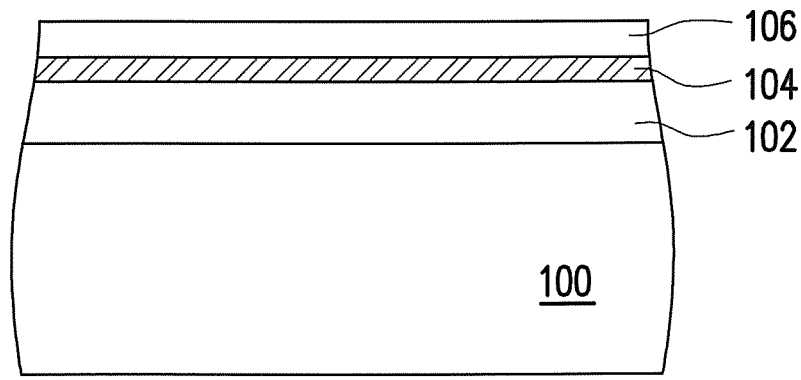
FIG. 1A to FIG. 1C are schematic cross-sectional views of a method of forming a fuse structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
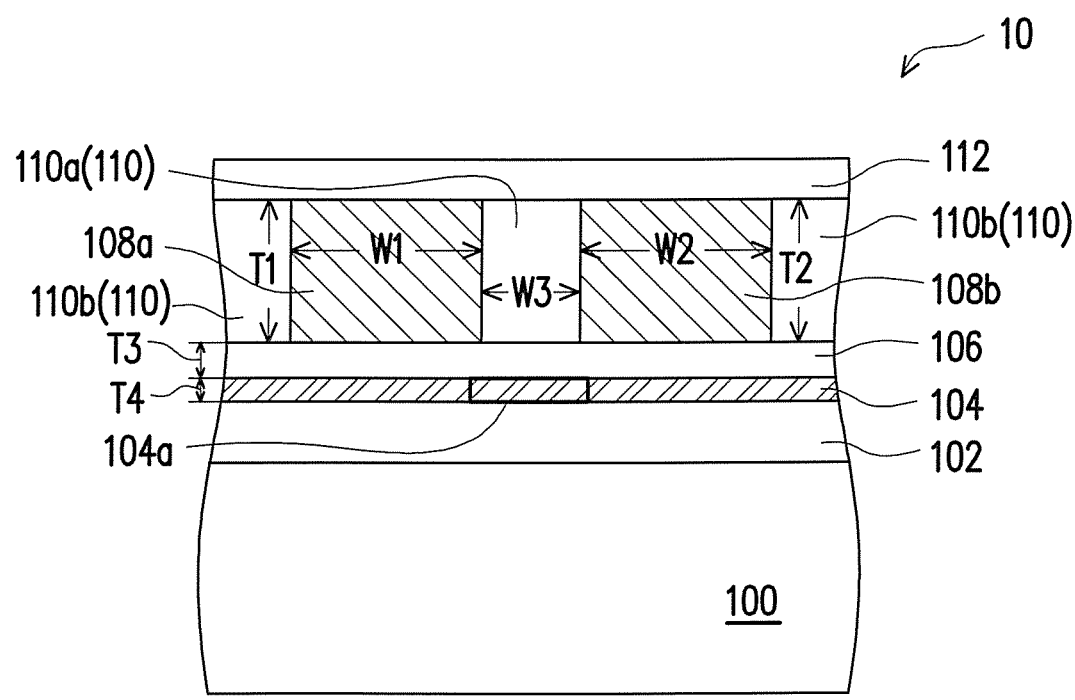
Figure 1C:
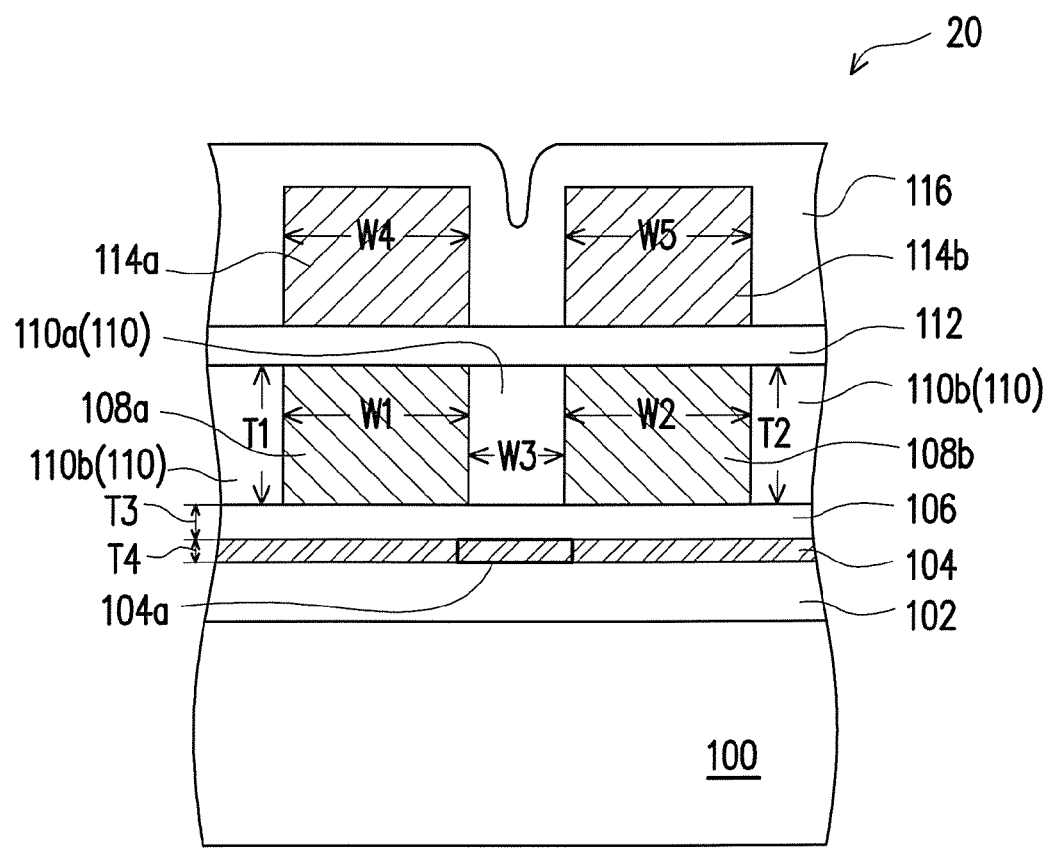
Figure 2A:
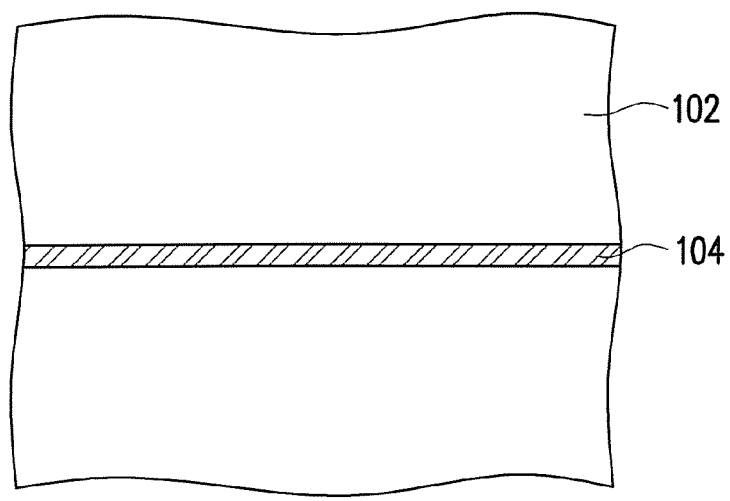
FIG. 2A to FIG. 2C are schematic top views of a method of forming a fuse structure in accordance with some embodiments.
Figure 2B:
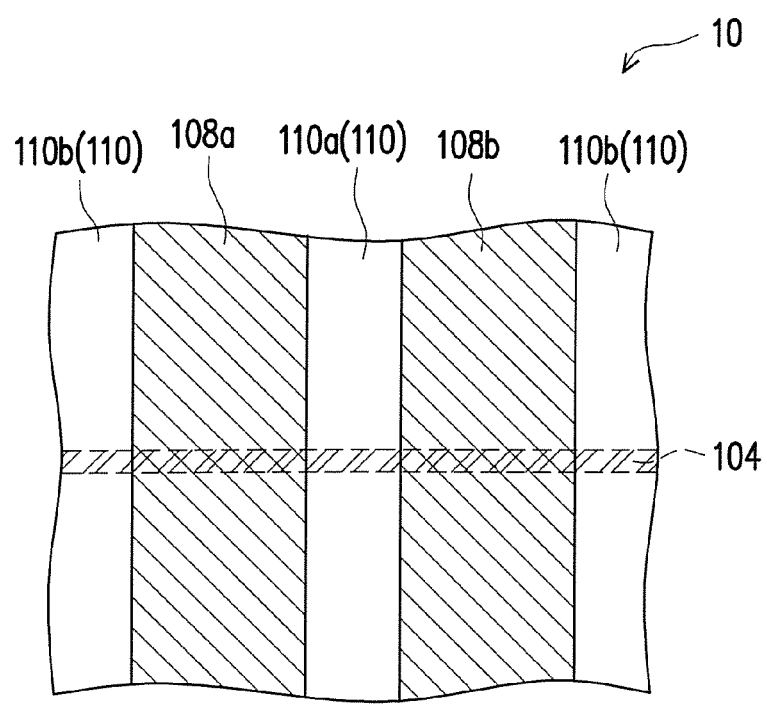
Figure 2C:
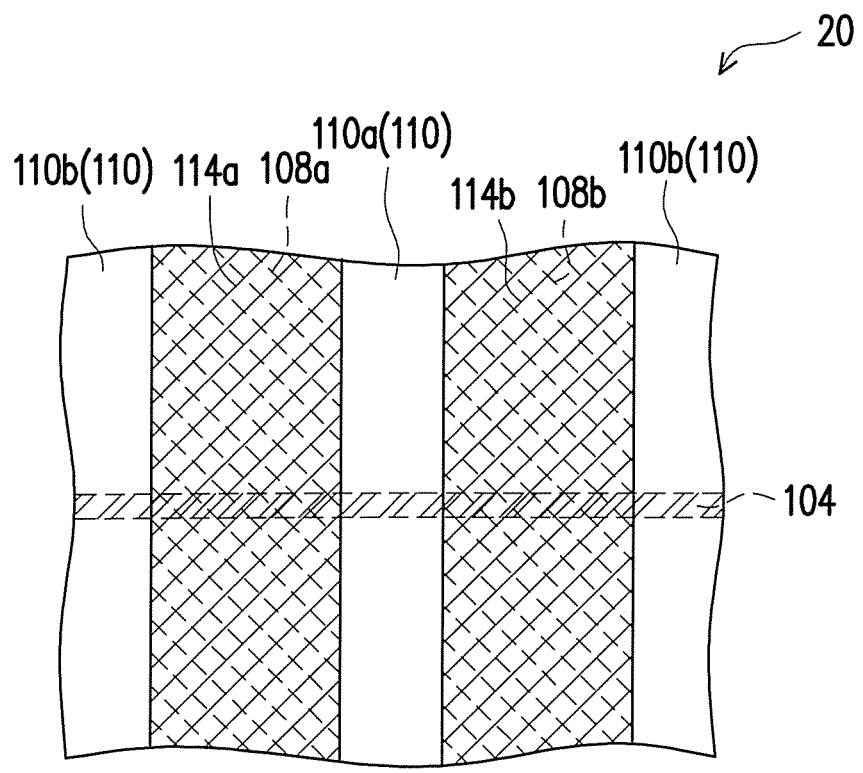

FIG. 1A to FIG. 1C are schematic cross-sectional views of a method of forming a fuse structure in accordance with some embodiments. FIG. 2A to FIG. 2C are schematic top views of a method of forming a fuse structure in accordance with some embodiments, in which some elements are omitted for clarity of illustration.

Referring to FIG. 1A and FIG. 2A, a substrate 100 is provided with an insulating layer 102 formed thereon. The substrate 100 includes, for example but not limited to, a bulk silicon substrate, a doped or un-doped substrate, or an active layer of a semiconductor-on-insulator (SOI) substrate. In some embodiments, the insulating layer 102 is a silicon oxide layer that is thermally grown in a wet or dry oxygen environment or is deposited by a suitable deposition technique such as chemical vapor deposition (CVD), atomic layer deposition (ALD) or the like.

Thereafter, a fuse strip 104 is formed over the insulating layer 102. In some embodiments, the fuse strip 104 is a metal fuse including aluminum, tungsten, copper or the like. In some embodiments, the fuse strip 104 is formed of a similar material and by a similar process as that used in forming a metal line of an interconnection structure. In alternative embodiments, the fuse strip 104 is a silicon-containing fuse including amorphous silicon, polysilicon or the like. In some embodiments, the fuse strip 104 is electrically connected to two circuits at two ends thereof.

It is noted that, the fuse strip 104 of the disclosure is a fuse element without pads at ends thereof, because it is not blown by passing a high current as that applied for an e-fuse. Besides, the fuse strip 104 of the disclosure is a fuse element without an exposed area to a laser beam, because it is not blown by irradiating a laser as that applied for a laser fuse. The mechanism of breaking the fuse strip 104 of the disclosure is described in details below.

Afterwards, a dielectric layer 106 is formed over the fuse strip 104. In some embodiments, the dielectric layer 106 covers the top of the fuse strip 104. In some embodiments, the dielectric layer 106 includes an insulating material or a dielectric material. For example, the dielectric layer 106 includes a nitride such as silicon nitride, an oxide such as silicon oxide, phosphosilicate glass (PSG), borosilicate glass (BSG), boron-doped phosphosilicate glass (BPSG), a low-k dielectric material, a combination thereof or the like. The low-k dielectric material may have a dielectric constant lower than about 3.8. The dielectric layer 106 is formed by a suitable fabrication technique such as spin-coating, CVD, plasma-enhanced chemical vapor deposition (PECVD) or the like.

Referring to FIG. 1B and FIG. 2B, two conductive strips 108a and 108b are formed over the dielectric layer 106 and across the fuse strip 104 and dielectric strips 110a and 110b are formed aside the conductive strips 108a and 108b. Specifically, the dielectric strip 110a is formed between the conductive strips 108a and 108b and the dielectric strips 110b are formed outside of the conductive strips 108a and 108b. In some embodiments, the fuse strip 104 extends in a first direction, and the conductive strips 108a and 108b and the dielectric strip 110a extend in a second direction different from the first direction. For example, the second direction is perpendicular to the first direction.

In some embodiments, each of the conductive strips 108a and 108b includes a thermal expansion and contraction material. Specifically, such thermal expansion and contraction material expands when heated and contracts or shrinks when cooled. In some embodiments, each of the conductive strips 108a and 108b has a linear coefficient of thermal expansion (or called "linear CTE") of greater than about 12 or a volume coefficient of thermal expansion (or called "volume CTE") of greater than about 36. For example, each of the conductive strips 108a and 108b includes aluminum, copper or an alloy thereof. In some embodiments, the conductive strips 108a and 108b are made of the same material. In alternative embodiments, the conductive strips 108a and 108b include different materials but exhibit a similar CTE value. In yet alternative embodiments, the conductive strips 108a and 108b include different materials with different CTE values.

In some embodiments, the width W1 of the conductive strip 108a is substantially the same as the width W2 of the conductive strip 108b. In alternative embodiments, the width W1 of the conductive strip 108a is different from the width W2 of the conductive strip 108b.

In some embodiments, each of the dielectric strips 110a and 110b includes an insulating material or a dielectric material. In some embodiments, each of the dielectric strips 110a and 110b has a linear CTE of less than about 4 or a volume CTE of less than about 12. For example, each of the dielectric strips 110a and 110b includes silicon oxide, silicon nitride, silicon oxynitride (SiON), silicon carbide (SiC), silicon carbonitride (SiCN), a combination thereof or the like.

In some embodiments, the conductive strips 108a and 108b are formed by a similar process as that used in forming ultra-thick metal (UTM) lines. In some embodiments, the dielectric strips 110a and 110b are formed prior to the formation of the conductive strips 108a and 108b. For example, a dielectric layer 110 is formed over the dielectric layer 106 by a deposition process, a portion of the dielectric layer 110 is removed to form openings in the dielectric layer 110, and the conductive strips 108a and 108b are formed in the openings by a deposition process or an electroplating process. The remaining dielectric layer 110 includes a dielectric strip 110a between the conductive strips 108a and 108b and dielectric strips 110b outside of the conductive strips 108a and 108b.

In alternative embodiments, the dielectric strips 110a and 110b are formed after the formation of the conductive strips 108a and 108b. For example, a conductive layer (not shown) is formed over the dielectric layer 106 by a deposition process, and the conductive layer is then patterned by a photolithography process. Thereafter, a dielectric layer 110 is formed over the conductive strips 108a and 108b and filled in the gap between the conductive strips 108a and 108b with a deposition process or a spin-coating process. A chemical mechanical polishing (CMP) process or an etching back process is then performed to the dielectric layer 110 until the tops of the conductive strips 108a and 108b are exposed. Thereby, the dielectric strip 110a is provided between the conductive strips 108a and 108b and the dielectric strips 110b are provided outside of the conductive strips 108a and 108b.

Thereafter, a dielectric layer 112 is formed over the conductive strips 108a and 108b. In some embodiments, the dielectric layer 112 includes an insulating material or a dielectric material and the forming method thereof includes performing a deposition technique such as CVD. In some embodiments, the dielectric layer 112 has a thickness similar to that of the dielectric layer 106. The fuse structure 10 of the disclosure is thus completed.

It is noted that, each of the respective widths W1 and W2 of the conductive strips 108a and 108b is at least 2 times the width W3 of the dielectric strip 110a between the conductive strips 108a and 108b. In some embodiments, the CTE of each of the conductive strips 108a and 108b is at least 3 times the CTE of the dielectric strip 110a between the conductive strips 108a and 108b. In some embodiments, each of the respective thicknesses T1 and T2 of the conductive strips 108a and 108b is at least 4 times the thickness T3 of the dielectric layer 106. In some embodiments, each of the respective thicknesses T1 and T2 of the conductive strips 108a and 108b is at least 5 times the thickness T4 of the fuse strip 104. By such manner, the fuse strip 104 of the fuse structure 10 of the disclosure is blown or destroyed by a thermal expansion and contraction characteristic, rather than by a high current/voltage or a laser energy.

Figure 4:
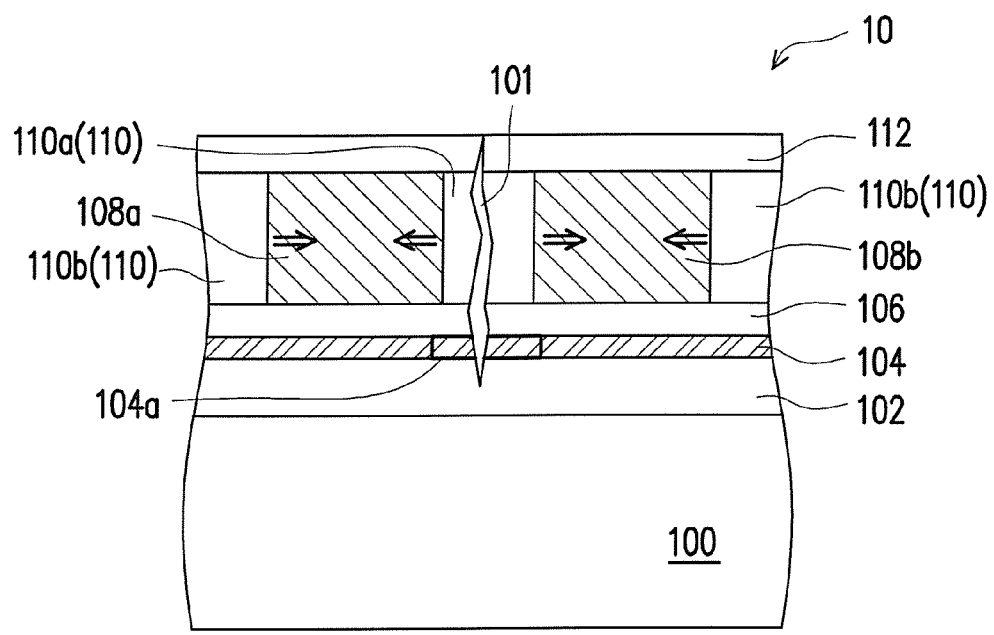
FIG. 4 to FIG. 6 are schematic cross-sectional views of broken fuse structures in accordance with some embodiments.

Specifically, the bulky conductive strips 108a and 108b expand during an annealing step, and contract or shrink during the subsequent cooling step, and therefore generate a crack 101 therebetween to break the adjacent fuse strip 104, as shown in FIG. 4. More specifically, in the cool-contraction step of the conductive strips 108a and 108b, the dielectric strip 110a is so over-stretched that a crack 101 occurs therein, and such crack 101 extends upwardly and downwardly to break the blowing region 104a of the fuse strip 104. In the present disclosure, no laser or current is required for the fuse blowing operation of the fuse structure 10. In some embodiments, the blowing region 104a of the fuse strip 104 corresponds to the dielectric strip 110a. Specifically, the blowing region 104a of the fuse strip 104 is right below the dielectric strip 110a.

In some embodiments, the thickness T3 of the dielectric layer 106 is greater than the thickness T4 of the fuse strip 104. In alternative embodiments, the thickness T3 of the dielectric layer 106 is equal to or less than the thickness T4 of the fuse strip 104. The ranges of the thicknesses T3 and T4 are not limited by the present disclosure, as long as the crack 101 can extend through the dielectric layer 106 and the underlying fuse strip 104.

In some embodiments, in order to further facilitate the fuse blowing operation, two additional conductive strips 114a and 114b are formed over the conductive strips 108a and 108b, as shown in FIG. 1C and FIG. 2C.

In some embodiments, the additional conductive strips 114a and 114b extend in a direction the same that of the conductive strips 108a and 108b. In some embodiments, the conductive strips 114a and 114b are formed by a similar process as that used in forming thick pads. In some embodiments, each of the conductive strips 114a and 114b includes a thermal expansion and contraction material. In some embodiments, each of the conductive strips 114a and 114b has a linear CTE of greater than about 12 or a volume CTE of greater than about 36. For example, each of the conductive strips 114a and 114b includes aluminum, copper or an alloy thereof. In some embodiments, the conductive strips 114a and 114b include a material the same as that of the conductive strips 108a and 108b. In alternative embodiments, the conductive strips 114a and 114b include a material different from that of the conductive strips 108a and 108b.

In some embodiments, the width W4 of the conductive strip 114a is substantially the same as the width W5 of the conductive strip 114b. In alternative embodiments, the width W4 of the conductive strip 114a is different from the width W5 of the conductive strip 114b.

In some embodiments, the conductive strips 114a and 114b are aligned with the conductive strips 108a and 108b. In alternative embodiments, the conductive strips 114a and 114b are shifted from the conductive strips 108a and 108b by a distance.

In some embodiments, the width W4 of the conductive strip 114a is substantially equal to the width W1 of the conductive strip 108a, and the width W5 of the conductive strip 114b is substantially equal to the width W2 of the conductive strip 108b, as shown in FIG. 1C. However, the present disclosure is not limited thereto. In alternative embodiments, the width W4 is less than the width W1 and the width W5 is less than the width W2. In yet alternative embodiments, the width W4 is greater than the width W1 and the width W5 is greater than the width W2.

Figure 5:
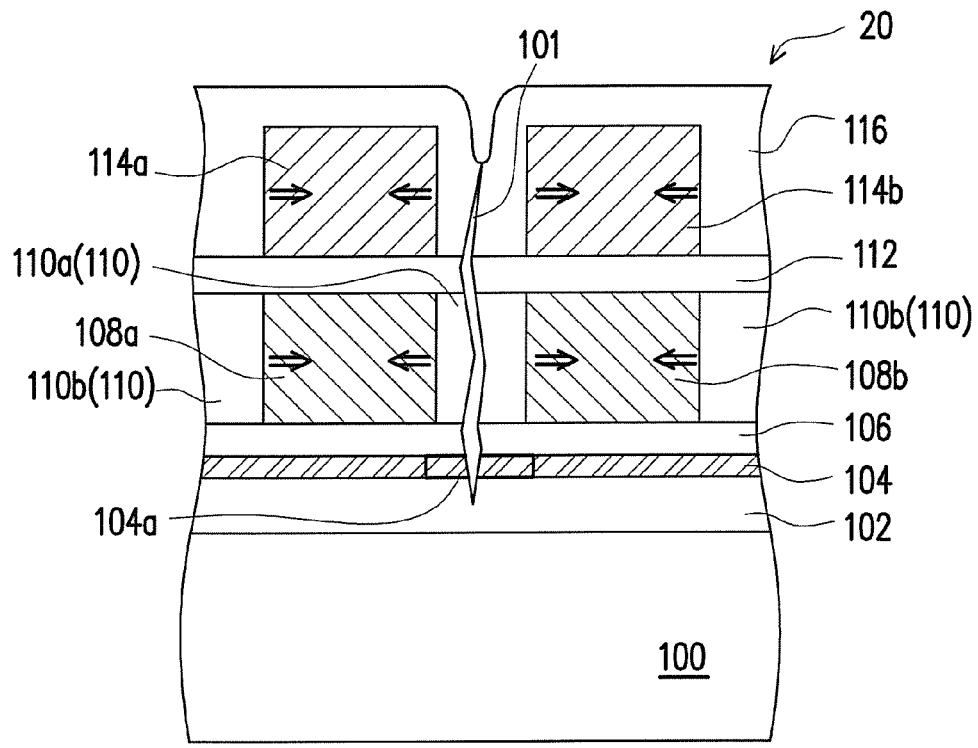

Thereafter, a dielectric layer 116 is formed over the additional conductive strips 114a and 114b. In some embodiments, the dielectric layer 116 includes an insulating material or a dielectric material and the forming method thereof includes performing a deposition technique such as CVD. The fuse structure 20 of the disclosure is thus completed. The fuse structure 20 of the disclosure is blown by a thermal expansion contraction characteristics. Specifically, the bulky conductive strips 108a and 108b and the overlying conductive strips 114a and 114b expand during an annealing step, and contract or shrink during the subsequent cooling step, and therefore generate a crack 101 therebetween to break the adjacent fuse strip 104, as shown in FIG. 5.

Figure 6:
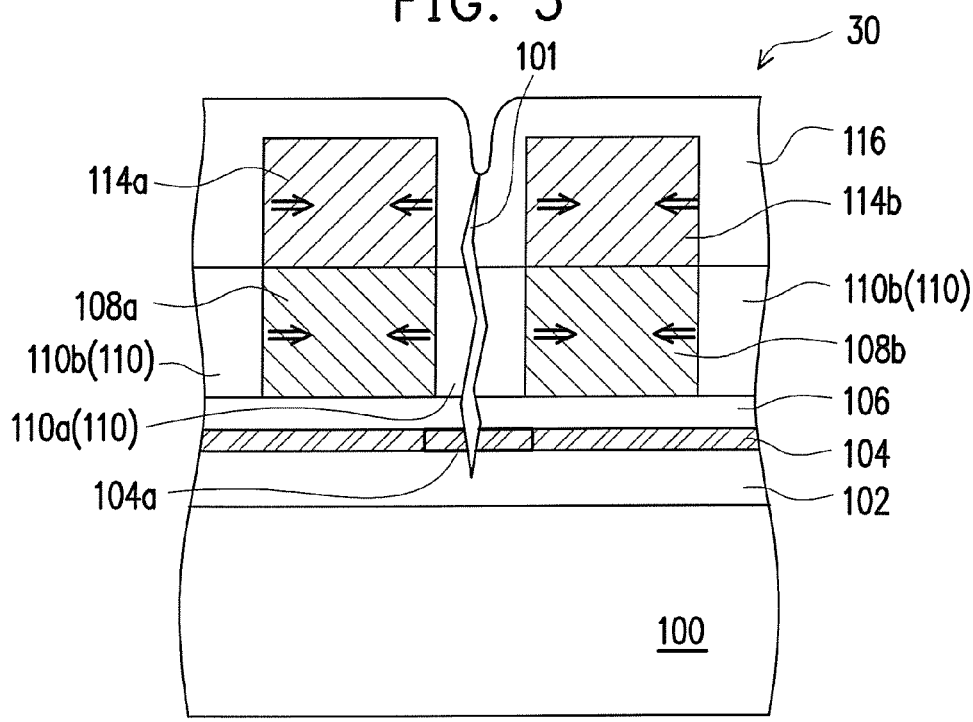

It is noted that, the dielectric layer 112 is an optional element in the present disclosure. Specifically, the conductive strips 114a and 114b can be formed in physical contact with the conductive strips 108a and 108b respectively, as shown in the fuse structure 30 of FIG. 3. In some embodiments, the conductive strips 114a and 114b are formed by a similar process as that used in forming plugs, and the conductive strips 108a and 108b are formed by a similar process as that used in forming lines. Similarly, with a thermal expansion contraction characteristics, the fuse strip 104 of the fuse structure 30 is blown at the blowing region 104a during the fuse blowing operation, as shown in FIG. 6.

Figure 3:
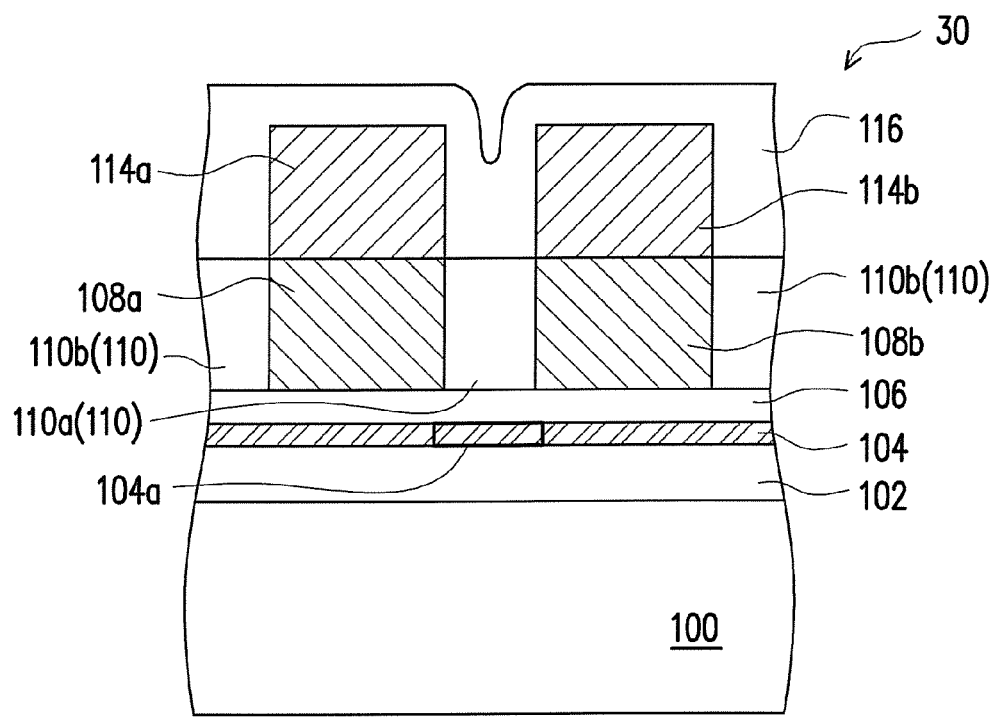
FIG. 3 is a schematic cross-sectional view of a fuse structure in accordance with some embodiments.
Figure 7:
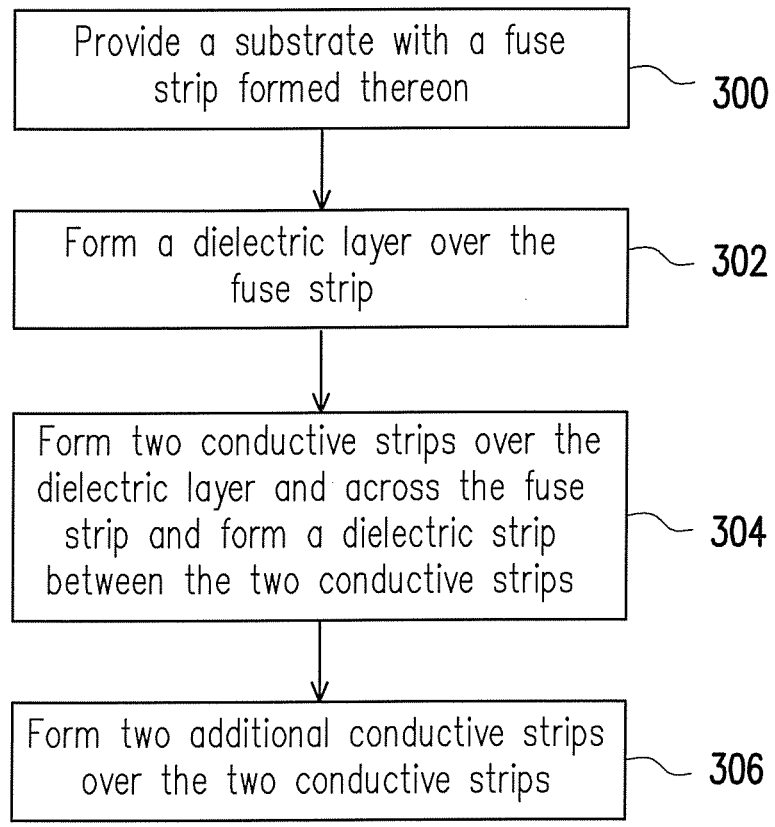
FIG. 7 is a flow chart illustrating a method of forming a fuse structure in accordance with some embodiments.

The above-mentioned process steps can be concisely illustrated with reference to the flow chart of FIG. 7. At step 300, a substrate 100 is provided with a fuse strip 104 formed thereon, as show in FIG. 1A. At step 302, a dielectric layer 106 is formed over the fuse strip 104, as shown in FIG. 1A. At step 304, conductive strips 108a and 108b are formed over the dielectric layer 106 and across the fuse strip 104 and a dielectric strip 110a is formed between the conductive strips 108a and 108b, as shown in FIG. 1B. At step 306, two additional conductive strips 114a and 114b are optionally formed over the conductive strips 108a and 108b, as shown in FIG. 1C and FIG. 3.

The said embodiments in which the fuse strip 104 of the fuse structure 10/20/30 is formed under the bulky conductive patterns (e.g. conductive strips 108a/108b/114a/114b) are provided for illustration purposes, and are not construed as limiting the present disclosure. In alternative embodiments, the fuse strip can be formed over the bulky conductive patterns or between the bulky conductive patterns.

Figure 8:
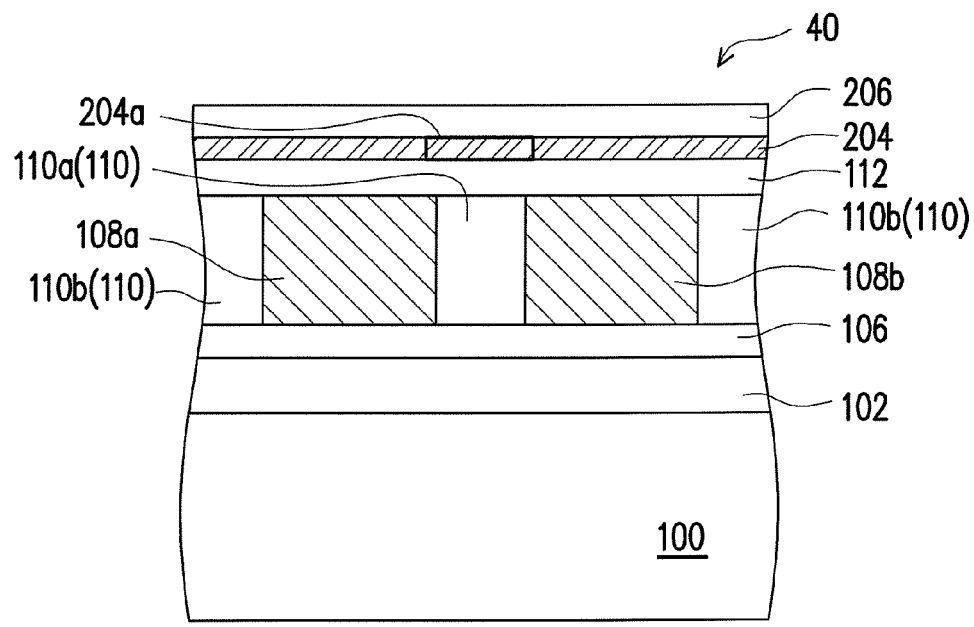
FIG. 8 to FIG. 9 are schematic cross-sectional views of fuse structures in accordance with alternative embodiments.
Figure 9:
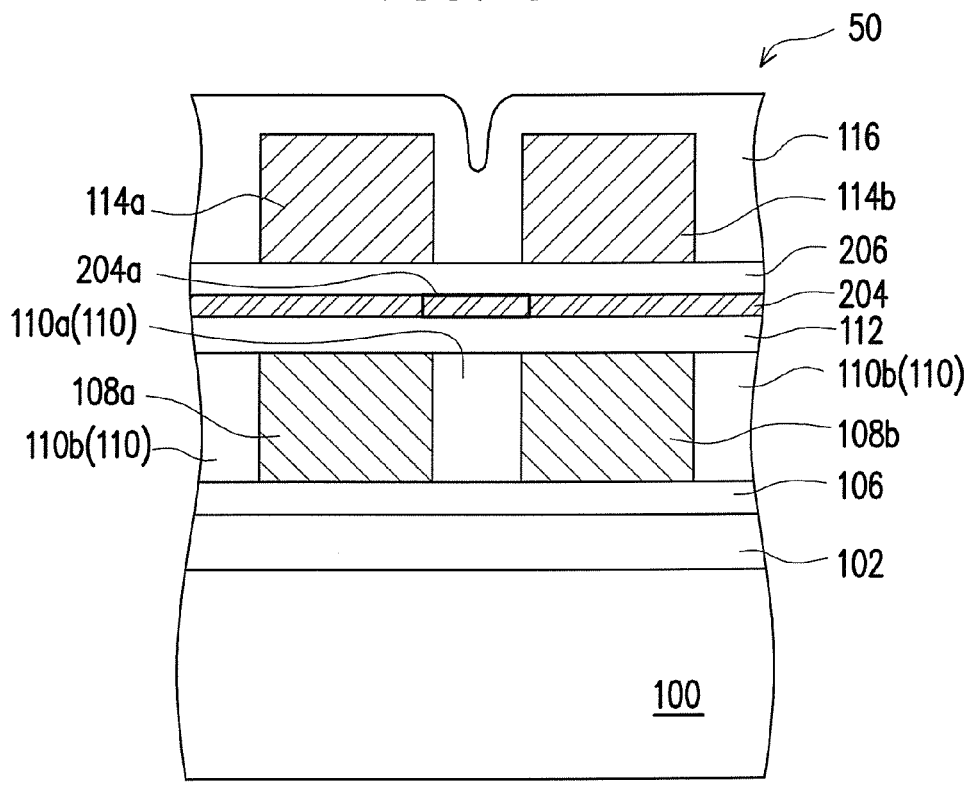
Figure 12:
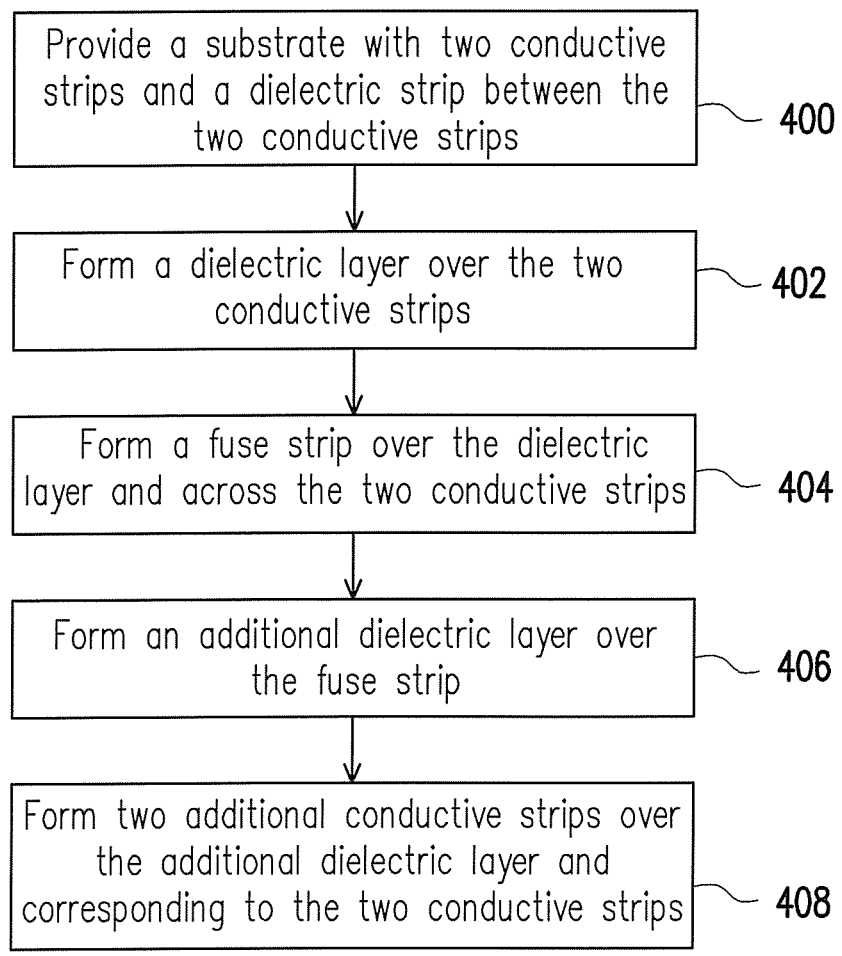
FIG. 12 is a flow chart illustrating a method of forming a fuse structure in accordance with alternative embodiments.

FIG. 8 to FIG. 9 are schematic cross-sectional views of fuse structures in accordance with alternative embodiments. FIG. 12 is a flow chart illustrating a method of forming a fuse structure in accordance with alternative embodiments. The flow chart of FIG. 12 is similar to that of FIG. 7, and the difference between them lies in the forming sequence of the fuse strip and the conductive strips.

Figure 10:
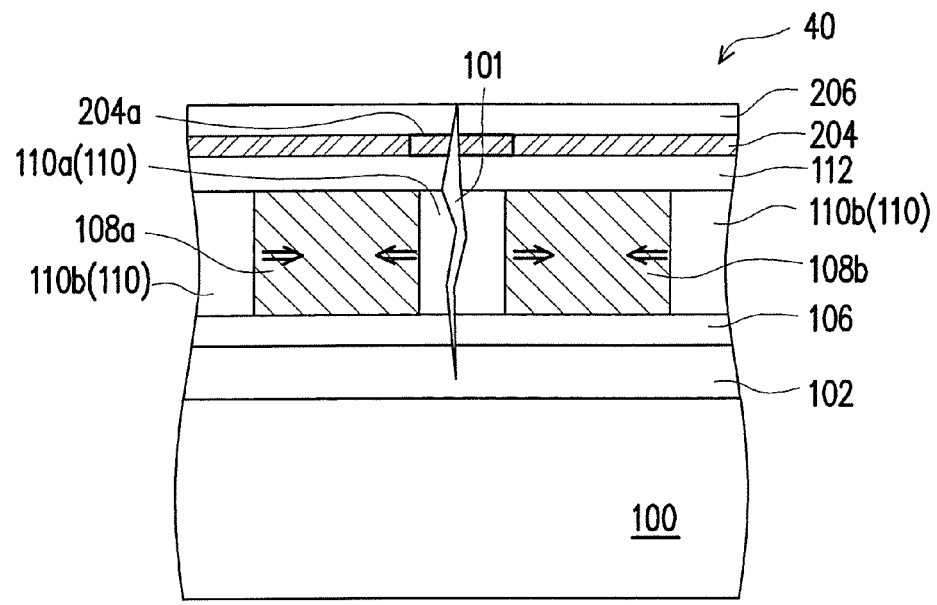
FIG. 10 to FIG. 11 are schematic cross-sectional views of broken fuse structures in accordance with alternative embodiments.
Figure 11:
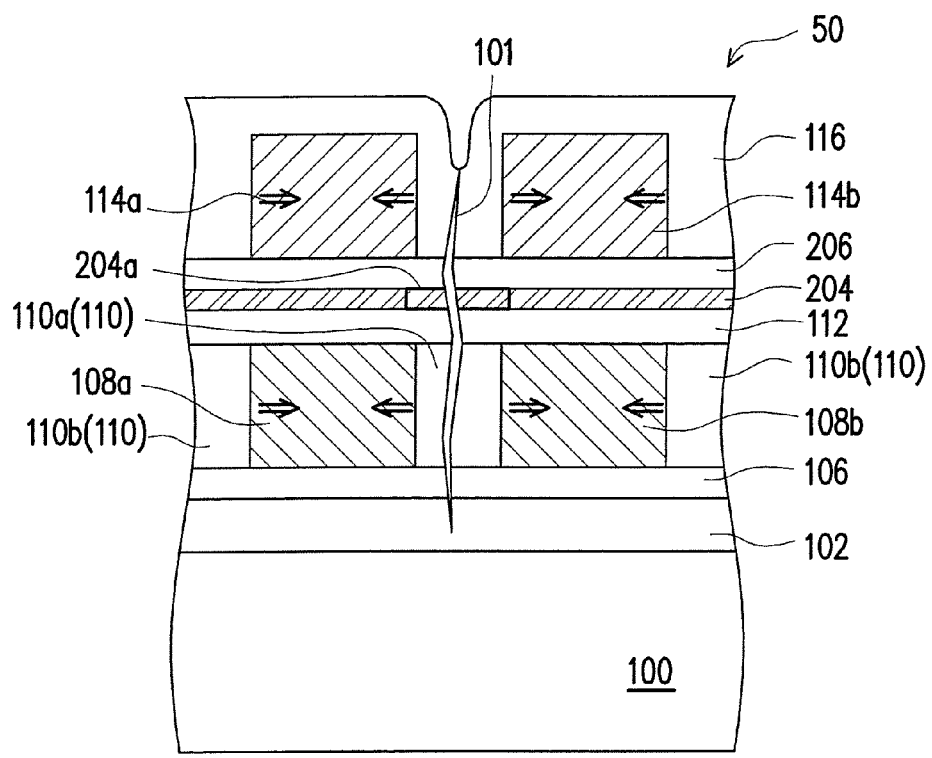

At step 400, a substrate 100 is provided with two conductive strips 108a and 108b and a dielectric strip 110a between the two conductive strips 108a and 108b. At step 402, a dielectric layer 112 is formed over the two conductive strips 108a and 108b. At step 404, a fuse strip 204 is formed over the dielectric layer 112 and across the conductive strips 108a and 108b. At step 406, an additional dielectric layer 206 is formed over the fuse strip 204. In some embodiments, the additional dielectric layer 206 has a thickness similar to that of the dielectric layer 106 or 112. At step 408, two additional conductive strips 114a and 114b are optionally formed over the additional dielectric layer 206 and corresponding to the two conductive strips 108a and 108b. In some embodiments, the blowing region 204a of the fuse strip 204 corresponds to the dielectric strip 110a. Specifically, the blowing region 204a of the fuse strip 204 is right above the dielectric strip 110a. The fuses structures 40 and 50 of the disclosure are thus completed, as shown in FIG. 8 and FIG. 9. Similarly, with a thermal expansion contraction characteristics, the fuse strip 204 of the fuse structure 40/50 is blown at the blowing region 204a during the fuse blowing operation, as shown in FIG. 10 and FIG. 11.

The fuse structures of the disclosure are described with reference to cross-sectional views of FIG. 1B, FIG. 1C, FIG. 3, FIG. 8 and FIG. 9 and the top views of FIG. 2B and FIG. 2C.

The fuse structure 10/20/30/40/50 includes a dielectric strip 110a sandwiched by conductive strips 108a and 108b, and a fuse strip 104/204 insulated from each of the conductive strips 108a and 108b and having a blowing region 104a/204a corresponding to the dielectric strip 110a. In some embodiments, the fuse structure 10/20/30/40/50 further includes additional conductive strips 114a and 114b over the conductive strips 108a and 108b. In some embodiments, the fuse strip is a metal line without pads at ends thereof. In some embodiments, the conductive strip 114a is insulated from the conductive strip 108a, and the conductive strip 114b is insulated from the conductive strip 108b, as shown in FIG. 1C and FIG. 9. In alternative embodiments, the conductive strip 114a is in contact with the conductive strip 108a, and the conductive strip 114b is in contact with the conductive strip 108b, as shown in FIG. 3.

In the fuse structure 10/20/30 as shown in FIG. 1B, FIG. 1C and FIG. 3, a substrate 100 is provided with a fuse strip 104 thereon. A dielectric layer 106 is over the fuse strip 104. The conductive strips 108a and 108b are over the dielectric layer 106 and across the fuse strip 104. A dielectric strip 110a is over the dielectric layer 106 and between the conductive strips 108a and 108b. In some embodiments, additional conductive strips 114a and 114b are over the conductive strips 108a and 108b, and a dielectric layer 116 is over the additional conductive strips 114a and 114b.

In the fuse structure 40/50 as shown in FIG. 8 and FIG. 9, a substrate 100 is provided with conductive strips 108a and 108b thereon. A dielectric strip 110a is over the substrate 100 and between the conductive strips 108a and 108b. A dielectric layer 112 is over the conductive strips 108a and 108b. A fuse strip 204 is over the dielectric layer 112 and across the conductive strips 108a and 108b. In some embodiments, additional conductive strips 114a and 114b are over the fuse strip 204, an additional dielectric layer 206 is between the fuse strip 204 and each of the additional conductive strips 114a and 114b, and a dielectric layer 116 is formed over the additional conductive strips 114a and 114b.

Figure 13:
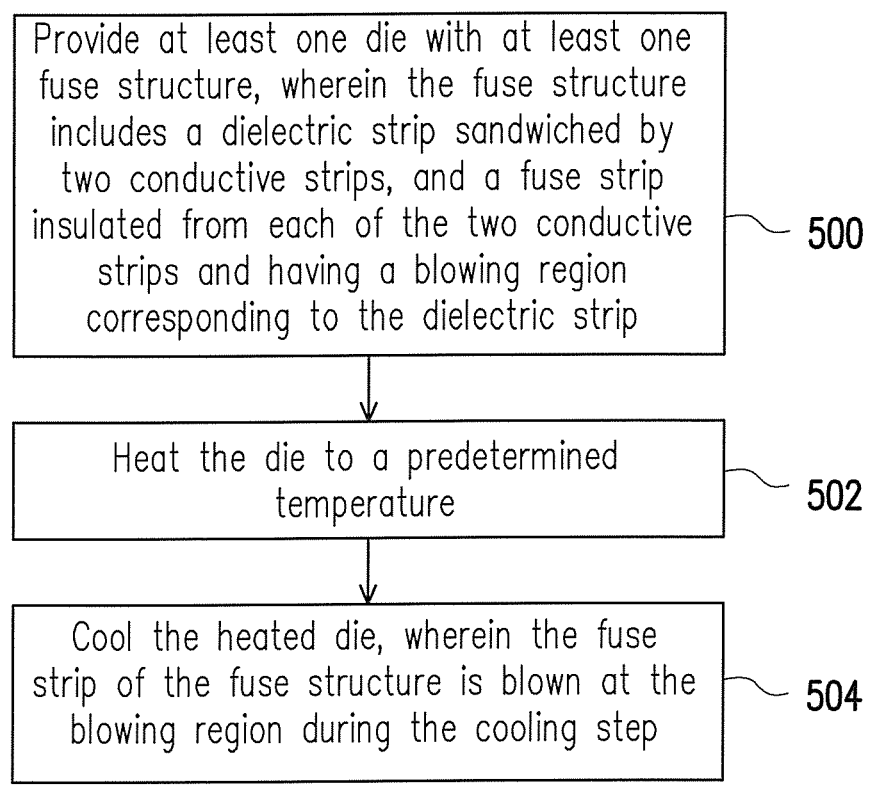
FIG. 13 is a flow chart illustrating a method of operating a fuse structure in accordance with some embodiments.

FIG. 13 is a flow chart illustrating a method of operating a fuse structure in accordance with some embodiments.

In a fuse providing step (step 500), at least one die is provided with at least one fuse structure 10/20/30/40/50 of the disclosure. In a fuse heating step (step 502), the die is heated to a predetermined temperature. In some embodiments, the predetermined temperature is about 300° C. to 600° C. The predetermined temperature can be adjusted upon the CTE values of the conductive strips and/or the width ratio of the conductive strips to the dielectric strip therebetween. In a fuse cooling and blowing step (step 504), the heated die is cooled, and the fuse strip 104/204 of the fuse structure 10/20/30/40/50 is blown at the blowing region 104a/204a during the step 504.

It is noted that in the disclosure, multiple fuse structures can be blown out simultaneously so as to significantly save the process time. During the operation of a conventional fuse such as an e-fuse or a laser fuse, the blowing step is operated one by one, so it is very time-consuming. However, in the present disclosure, the novel fuse structure is operated based on the mechanism of the thermal expansion and contraction, so multiple fuse strips of the disclosure can be blown at the same time. Specifically, when a plurality of dies are provided with a plurality of fuse structures 10/20/30/40/50 of the disclosure respectively, the fuse strips 104/204 of the fuse structures 10/20/30/40/50 of the plurality of the dies are blown out simultaneously during the fuse cooling and blowing step 504. That is, each blowing operation breaks multiple fuse structures of multiple dies at the same time, so the process time is significantly saved.

The fuse structures of the disclosure are not limited by the above-mentioned embodiments. Fuse structures are contemplated as falling within the spirit and scope of the present disclosure as long as the fuse elements of the fuse structures are broken by a crack generated by the thermal expansion and contraction of the adjacent elements.

In summary, the present disclosure provides a novel fuse structure that is operated by a thermal expansion contraction characteristic rather than by a current or a laser. Specifically, by designing the widths, sizes, thicknesses and/or CTE values of the elements adjacent to the fuse element or fuse strip, a crack is generated in the fuse structure and therefore the fuse element is broken. Besides, multiple fuse elements of multiple dies can be operated at the same time, so as to significantly reduce the process time and therefore the process cost.

In accordance with some embodiments of the present disclosure, a fuse structure includes a dielectric strip sandwiched by a first conductive strip and a second conductive strip, and a fuse strip insulated from each of the first conductive strip and the second conductive strip and having a blowing region corresponding to the dielectric strip.

In accordance with alternative embodiments of the present disclosure, a fuse structure includes a fuse strip, a first dielectric layer, two conductive strips and a dielectric strip. The first dielectric layer is over the fuse strip. The two conductive strips are over the first dielectric layer and across the fuse strip. The dielectric strip is over the first dielectric layer and between the conductive strips. Besides, a CTE of the conductive strips is at least 3 times a CTE of the dielectric strip, and a width of the conductive strips is at least 2 times a width of the dielectric strip.

In accordance with yet alternative embodiments of the present disclosure, a method of operating a fuse structure includes the following steps. At least one die is provided with at least one fuse structure. The fuse structure includes a dielectric strip sandwiched by a first conductive strip and a second conductive strip, and a fuse strip insulated from each of the first conductive strip and the second conductive strip and having a blowing region corresponding to the dielectric strip. Thereafter, the die is heated to a predetermined temperature. Afterwards, the heated die is cooled, and the fuse strip is blown at the blowing region during the cooling step.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fuse structure, comprising: a dielectric strip sandwiched by a first conductive strip and a second conductive strip, and
   a fuse strip, connected to two circuits and insulated from each of the first conductive strip and the second conductive strip and having a blowing region corresponding to the dielectric strip,
   wherein the CTE (coefficient of thermal expansion) of the two conductive strips is at least 3 times of the CTE of the dielectric strip, so the fuse strip breaks upon heating and cooling in the blowing region due to a difference between the CTE of the two conductive strips and of the CTE of the dielectric strip.

2. The fuse structure of claim 1, wherein from a top view, the fuse strip extends in a first direction, and the dielectric strip, the first conductive strip and the second conductive strip extend in a second direction different from the first direction.

3. The fuse structure of claim 1, wherein a width of each of the first conductive strip and the second conductive strip is at least 2 times a width of the dielectric strip.

4. The fuse structure of claim 1, wherein the fuse strip is a metal line without pads at ends thereof.

5. The fuse structure of claim 1, wherein a thickness of each of the first conductive strip and the second conductive strip is at least 5 times a thickness of the fuse strip.

6. The fuse structure of claim 1, further comprising:
   a third conductive strip over the first conductive strip, and
   a fourth conductive strip over the second conductive strip.

7. The fuse structure of claim 6, wherein the third conductive strip is insulated from the first conductive strip, and the fourth conductive strip is insulated from the second conductive strip.

8. The fuse structure of claim 6, wherein the third conductive strip is in contact with the first conductive strip, and the fourth conductive strip is in contact with the second conductive strip.

9. The fuse structure of claim 6, wherein a CTE of each of the third conductive strip and the fourth conductive strip is at least 3 times a CTE of the dielectric strip.

10. The fuse structure of claim 6, wherein a thickness of each of the third conductive strip and the fourth conductive strip is 5 times a thickness of the fuse strip.

11. A fuse structure, comprising:
a fuse strip connected to two circuits;
a first dielectric layer over the fuse strip;
two conductive strips over the first dielectric layer and across the fuse strip;
a dielectric strip over the first dielectric layer and between the conductive strips; and
a second dielectric layer over the two conductive strips,
wherein a CTE of the conductive strips is at least 3 times of a CTE of the dielectric strip, and a width of the conductive strips is at least 2 times of a width of the dielectric strip, so the fuse strip breaks upon heating and cooling in a blowing region due to a difference between the CTE of the two conductive strips and of the CTE of the dielectric strip,
wherein from a top view, the fuse strip extends in a first direction, and the conductive strips extend in a second direction different from the first direction.

12. The fuse structure of claim 11, wherein the fuse strip is a metal line without pads at ends thereof.

13. The fuse structure of claim 11, wherein a thickness of the conductive strips is at least 4 times a thickness of the first dielectric layer.

14. The fuse structure of claim 11, further comprising two additional conductive strips respectively over the two conductive strips.

15. The fuse structure of claim 14, wherein a CTE of the two additional conductive strips is at least 3 times a CTE of the dielectric strip, and a thickness of the two additional conductive strips is at least 4 times a thickness of the first dielectric layer.

16. The fuse structure of claim 14, wherein the second dielectric layer is located between each of the two additional conductive strips and each of the two conductive strips.

* * * * *